United States Patent
Shih et al.

(10) Patent No.: US 9,680,030 B1
(45) Date of Patent: Jun. 13, 2017

(54) ENHANCEMENT-MODE FIELD EFFECT TRANSISTOR HAVING METAL OXIDE CHANNEL LAYER

(71) Applicant: Advanced Device Research Inc., Taipei (TW)

(72) Inventors: Chen-Wei Shih, Tainan (TW); Albert Chin, Kaohsiung (TW)

(73) Assignee: Advanced Device Research Inc., Taipei (TW)

( * ) Notice: Subject to any disclaimer, the term of this patent is extended or adjusted under 35 U.S.C. 154(b) by 0 days.

(21) Appl. No.: 14/956,805

(22) Filed: Dec. 2, 2015

(51) Int. Cl.
| | |
|---|---|
| *H01L 29/786* | (2006.01) |
| *H01L 29/24* | (2006.01) |
| *H01L 29/04* | (2006.01) |
| *H01L 29/423* | (2006.01) |
| *H01L 21/02* | (2006.01) |
| *H01L 27/12* | (2006.01) |

(52) U.S. Cl.
CPC .......... *H01L 29/7869* (2013.01); *H01L 29/04* (2013.01); *H01L 29/24* (2013.01); *H01L 29/42356* (2013.01); *H01L 29/42364* (2013.01); *H01L 29/78648* (2013.01); *H01L 21/02565* (2013.01); *H01L 27/1225* (2013.01)

(58) Field of Classification Search
CPC .......... H01L 29/7869; H01L 29/78693; H01L 21/02565; H01L 21/02554; H01L 21/02472
See application file for complete search history.

(56) References Cited

U.S. PATENT DOCUMENTS

| | | | |
|---|---|---|---|
| 7,189,992 B2 | 3/2007 | Wager, III et al. | |
| 7,282,782 B2 * | 10/2007 | Hoffman | H01L 29/7869 257/59 |
| 8,389,996 B2 | 3/2013 | Yabuta et al. | |
| 9,190,475 B2 * | 11/2015 | Sunamura | H01L 21/8254 |
| 2003/0218222 A1 * | 11/2003 | Wager, III | H01L 29/02 257/410 |
| 2011/0240988 A1 * | 10/2011 | Yano | H01L 29/78609 257/43 |
| 2013/0075740 A1 * | 3/2013 | Fortunato | H01L 21/02565 257/63 |

OTHER PUBLICATIONS

"Tin oxide transparent thin-film transistors" by R E Presley et al. in Journal of Physics D: Applied Physics, J. Phys. D: Appl. Phys 37 (2004) 2810-2813, "Presley".*

(Continued)

*Primary Examiner* — Eric Ward
(74) *Attorney, Agent, or Firm* — Alan D. Kamrath; Kamrath IP Lawfirm, P.A.

(57) ABSTRACT

An enhancement-mode n-type field effect transistor is disclosed to have a metal oxide channel layer, a gate dielectric layer, a gate electrode, a source electrode, and a drain electrode. The metal oxide channel layer has a material selected from $SnO_2$, ITO, ZnO, $SnO_2$ and $In_2O_3$. The metal oxide channel layer has a thickness less than a threshold value to exhibit pinch-off behavior in transfer characteristics and has a mobility trend without saturation under positive operational voltage.

27 Claims, 11 Drawing Sheets

(56) References Cited

OTHER PUBLICATIONS

"Plasma-assisted molecular beam epitaxy and characterization of $SnO_2$ (101) on r-plane sapphire" in Journal of Vacuum Science and Technology A. 26(5) (2008) by M.E. White et al.*

"Electron transport and defect structure in highly conducting reactively sputtered ultrathin tin oxide films" in Applied Physics Letters 104, 082108 (2014) to Shikha Bansal et al.*

"High electron mobility in epitaxial $SnO_2$-x in semiconducting regime" in APL Materials, vol. 3 Issue 7, 076107 2015 by Myosik Mun et al.*

* cited by examiner

ENHANCEMENT-MODE FIELD EFFECT TRANSISTOR HAVING METAL OXIDE CHANNEL LAYER

FIELD OF THE DISCLOSURE

The present invention relates to an enhancement-mode field effect transistor, especially an enhancement-mode n-type thin-film transistor having metal oxide channel layer.

BACKGROUND OF THE INVENTION

Field effect transistors are used in a variety of electronic devices depending on their electrical properties, manufacturing processes, cost, etc. One kind of the field effect transistors, thin-film transistors (TFTs), is mainly used in liquid crystal display (LCD) screens as switching devices and driving devices. As such, switching speeds of the TFTs are critical.

Amorphous silicon TFTs, polysilicon TFTs and metal oxide TFTs are the most widely used TFTs. Amorphous silicon TFTs can be produced with low cost due to good uniformity of amorphous silicon films of large dimensions, but they suffer from relatively low mobility. Polysilicon TFTs have higher mobility compared to amorphous silicon TFTs, but their manufacturing processes are complex and they exhibit poor uniformity when applied to large panels. Metal oxide TFTs are viewed as candidates having potentials to replace amorphous silicon TFTs and polysilicon TFTs and have received lots of attentions.

It was found that epitaxial $SnO_x$ (x is zero or a positive number) films exhibit good p-type semiconductor characteristics and may function as a channel layer for p-type TFTs. However, it is difficult to produce high quality epitaxial $SnO_x$ films of large dimensions.

Moreover, sometimes complementary transistors (n-type and p-type transistors) are needed for periphery circuits outside pixel regions of the LCD screens. P-type transistors alone are hardly satisfactory.

SUMMARY OF THE INVENTION

An aspect of the present invention provides an enhancement-mode n-type field effect transistor comprising a metal oxide channel layer, a gate dielectric layer, a gate electrode, a source electrode, and a drain electrode. The metal oxide channel layer comprises a material selected from $SnO_2$, ITO, ZnO, $SnO_2$ and $In_2O_3$ and has a thickness less than a threshold value. With the thickness less than the threshold value the metal oxide channel layer exhibits pinch-off behavior in transfer characteristics and has a mobility trend without saturation under positive operational voltage.

Another aspect of the present invention provides an enhancement-mode n-type field effect transistor comprising a metal oxide channel layer, a gate dielectric layer, a gate electrode, a source electrode, and a drain electrode. The metal oxide channel layer is at amorphous state or nanocrystalline state and comprises a material selected from $SnO_2$, ITO, ZnO, $SnO_2$ and $In_2O_3$.

Another aspect of the present invention provides an enhancement-mode n-type field effect transistor comprising a metal oxide channel layer, a gate dielectric layer, a gate electrode, a source electrode, and a drain electrode. The metal oxide channel layer comprises a material selected from $SnO_2$, ITO, ZnO, $SnO_2$ and $In_2O_3$ and has a conductivity less than an upper threshold value to have proper pinch off behavior in transfer characteristics and more than a lower threshold value to be semi-conductive.

According to one embodiment of the present invention, the metal oxide channel layer comprises $SnO_2$ having a thickness less than 10 nm and under a positive gate voltage an effective mobility of 147 $cm^2/Vs$ is obtained.

According to one embodiment of the present invention, the metal oxide channel layer comprises $SnO_2$ and the upper threshold value is $5\times10^5$ S/m while the lower threshold value is 1 S/m.

According to one embodiment of the present invention, the gate dielectric layer comprises a thickness ranging from 30 nm to 150 nm and may be a high-k dielectric material.

According to one embodiment of the present invention, the enhancement-mode n-type field effect transistor is a bottom-gate type field effect transistor further optionally comprising an etching stop layer between the metal oxide channel layer and the source electrode and the drain electrode or further optionally comprising another gate electrode and another gate dielectric layer.

According to one embodiment of the present invention, the enhancement-mode n-type field effect transistor is a top-gate type field effect transistor.

DESCRIPTION OF THE PREFERRED EMBODIMENTS

The following descriptions illustrate embodiments of the present invention in detail. All the components, sub-portions, structures, materials and arrangements therein can be arbitrarily combined in any sequence despite their belonging to different embodiments and having different sequence originally. All these combinations are considered to fall into the scope of the present invention which is defined by the appended claims.

There are a lot of embodiments and figures within this application. To avoid confusions, similar components are designated by the same or similar numbers. To simplify figures, repetitive components are only marked once. Furthermore, in the detailed top views or cross-sectional views only a partial layout is shown for illustration but a person skilled in the art can understand a complete layout may comprise a plurality of the partial layouts and more.

Figure 1:
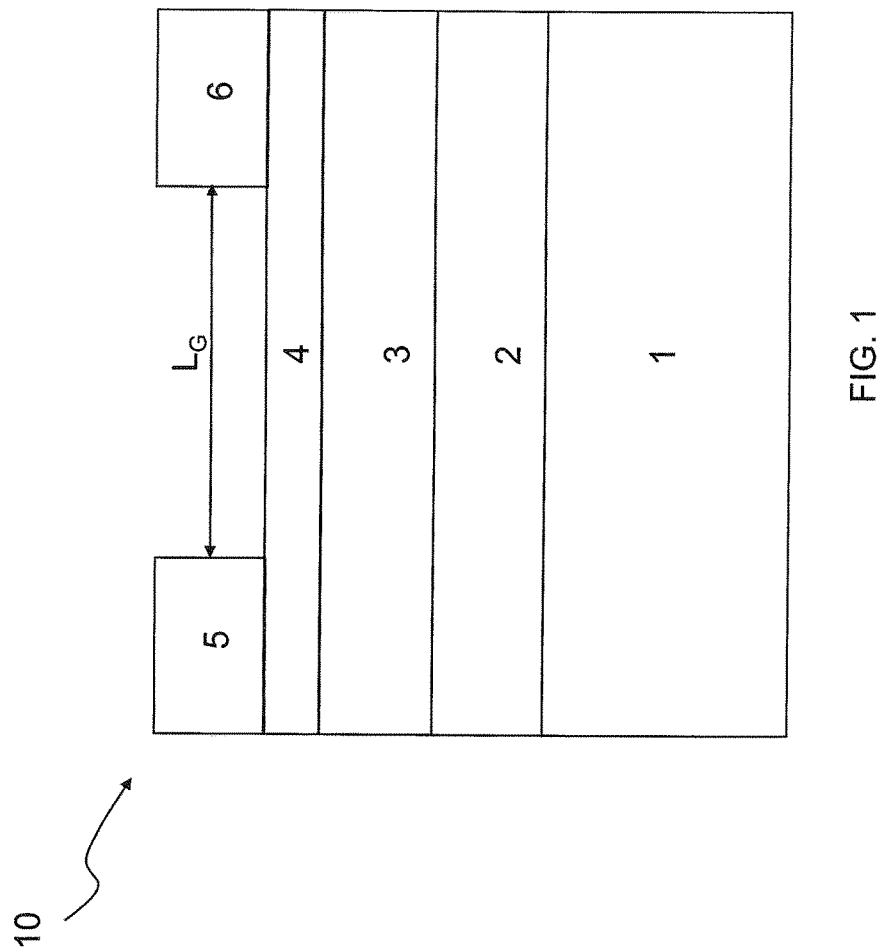
FIG. 1 is a schematic cross-sectional view illustrating an exemplary field effect transistor (FET) structure according to an embodiment of the present invention.

Now a basic field effect transistor of the present invention and its electrical performances are discussed in conjunction with FIGS. 1-4. Specifically, such basic field effect transistor is a wide band gap high mobility transistior. This basic field effect transistor can be used in an active matrix of a display screen device, a pheriphery circuitry such as a logic inverter, an amplifier, etc. FIG. 1 is a schematic cross-sectional view illustrating an exemplary FET structure 10 according to an embodiment of the present invention. The FET structure 10 is a bottom-gate type enhancement-mode n-type FET with ultra-thin metal oxide channel layer. The term "enhancement-mode" used here for describing behaviors of a transistor is exchangeable with the term "normally-off" and means a transistor has negligible current (i.e., leakage current) between a source and a drain at zero gate voltage (gate bias). An "enhancement-mode" transistor is in contrast to a "depletion-mode" transistor which has conducting current flowing between its source and drain at zero gate voltage. The term "n-type FET" used here means the majority carrier provided from source of a field effect transistor and the carriers extracted by drain of the field effect transistor are electrons instead of holes. The term "ultra-thin metal oxide channel layer" under the context of the present invention means a metal oxide channel layer having a thickness less than a threshold value. Such threshold value for $SnO_2$ is 10 nm. However, for other metal oxide materials, such threshold value is so defined that with a thickness less than such threshold value a metal oxide would exhibit pinch-off behavior in transfer characteristics and has a mobility trend without saturation region under positive $V_{GS}$. With such a threshold thickness, the metal oxide channel layer has an upper threshold conductivity. When the thickness of the metal oxide channel layer reduces (i.e. lower than the threshold thickness), the conductivity of the metal oxide channel layer reduces while the metal oxide channel layer still exhibits pinch off behavior. However, the conductivity may not be too low (i.e. less than a lower threshold conductivity) because low conductivity would lead to detrimental high channel resistance. Thus, the conductivity of the metal oxide channel layer for an n-type FET is bounded by the upper threshold conductivity and the lower threshold conductivity.

Preferably, for the metal oxide channel layer to have proper pinch off behavior and to be semi-conductive instead of insulating, the upper threshold conductivity is about $5 \times 10^5$ S/m and the lower threshold conductivity is about 1 S/m; i.e., the conductivity of the metal oxide channel layer is between $5 \times 10^5$ S/m and 1 S/m. The FET structure 10 of the present invention comprises a substrate 1, a gate electrode 2 (a n-type heavily-doped silicon layer in this embodiment), a channel layer 4 (a stannic oxide $SnO_2$ film in this embodiment), a gate dielectric layer 3 (a high-k dielectric layer (a hafnium dioxide $HfO_2$ layer in this embodiment) interposed between the gate electrode 2 and the channel layer 4, and a source electrode 5 and a drain electrode 6 (both aluminum Al layers in this embodiment) physically separated from the gate electrode 2 by the gate dielectric layer 3. The channel layer 4 provides a controllable electrical pathway between the source electrode 5 and the drain electrode 6. The channel length $L_G$ is roughly defined as the distance between the source electrode 5 and the drain electrode 6 that is electrically controllable by the gate electrode 2 during operation of the FET structure 10. For example, the substrate 1 may be a glass substrate, a single crystalline Si substrate, a silicon-on-insulator (SOI) substrate, a material substrate with a strained layer thereon, a material substrate with an insulating layer thereon, etc. For example, the gate electrode 2 may use metal oxides such as indium-tin oxide (ITO), n-type doped $In_2O_3$, $SnO_2$, ZnO, conductive materials such as In, Sn, Ga, Zn, Al, Ti, Ag, Cu, Mo, Nd, or any combination thereof. The thickness of the gate electrode 2 is not limited to a specific range of values as long as the FET structure 10 functions normally and delivers satisfactory performance. For example, the channel layer 4 may use one or more metal oxides selected from $SnO_2$, ITO, ZnO, $SnO_2$, $In_2O_3$, etc. The present invention mainly focuses on $SnO_2$ and its electrical characteristics, but the results and conclusions obtained for $SnO_2$ may be equally applied to other metal oxides listed above. The thickness of the channel layer 4 ($SnO_2$ film in this embodiment) is varied from 3.5 nm to 20 nm in order to discover how the thickness of the channel layer 4 affects the performance of the FET structure 10 (See FIG. 2-4 and descriptions thereof below), but the thickness of the channel layer 4 is preferably less than 10 nm as shown from the results of FIG. 2-4. If other metal oxides are used as the channel layer 4, the preferable thickness range thereof may vary according to their physical and/or chemical properties. For example, the gate dielectric layer 3 may use a commonly used dielectric material for field effect transistors such as silicon dioxide ($SiO_2$), a high-k dielectric material such as silicon nitride ($Si_3N_4$), oxynitride (SiON), hafnium silicate ($HfSiO_4$) with or without impurities such as nitrogen atoms, hafnium dioxide ($HfO_2$) with or without impurities, zirconium silicate ($ZrSiO_4$) with or without impurities, zirconium dioxide ($ZrO_2$) with or without impurities, aluminum oxide ($Al_2O_3$), a combination thereof, or any dielectric materials having dielectric constant higher than that of $SiO_2$. The thickness of the gate dielectric layer 3 is not limited to a specific range of values but with considerations of device leakage current in mind it is preferably to use a thickness higher than the thickness of the channel layer 4. It is noted that the thinner the gate dielectric layer is the higher leakage current occurs due to tunneling effect. In a specific embodiment, the thickness of the gate dielectric layer 3 ranges from 30 nm to 150 nm depending on the dimension of the FET structure 10, the dielectric constant of the gate dielectric layer 3 and the thickness of the channel layer 4. For example, the source electrode 5 and the drain electrode 6 may use the same materials that can be used as gate electrode 2. The thicknesses of the source electrode 5 and the drain electrode 6 are not limited to a specific range of values as long as the FET structure 10 functions normally and delivers satisfactory performance. Since the source electrode 5 and the drain electrode 6 are usually formed from the same material layer(s) and by the same patterning processes such as lithography process and etching processes, they usually have the same thickness.

Now still referring to FIG. 1, in order to fabricate the FET structure 10, a method for manufacturing a field effect transistor structure is disclosed. First, a substrate 1 is provided. Next, a gate electrode layer (n-type heavily-doped silicon layer in this embodiment) is formed through chemical vapor deposition (CVD) process and patterned through lithography and etching processes to become the gate electrode 2. The gate electrode layer may also be formed through evaporation deposition process, physical vapor deposition (PVD) process, electroplating process, atomic-layer deposition (ALD) process, etc. and patterned through lift-off process if other material(s) is used. Then, the gate dielectric layer 3 (a hafnium dioxide $HfO_2$ layer in this embodiment) is formed through CVD process or ALD process depending on its thickness. The gate dielectric layer 3 may also be formed through low-pressure CVD (LPCVD) process, sub-atmospheric CVD (SACVD) process, etc. It is noted that sometimes hafnium dioxide $HfO_2$ layer may not be compatible with silicon layer, so an interfacial layer such as a silicon dioxide $SiO_2$ layer is formed between the silicon gate layer 2 and the gate dielectric $HfO_2$ layer 3. Next, a channel layer (an amorphous or nano-crystalline $SnO_2$ layer in this embodiment) is formed through evaporation deposition process, annealed for example at 400° C. by rapid thermal anneal process for example in an environment containing oxygen gas and patterned through lithography and etching processes to become the channel layer 4. The channel layer as deposited is at amorphous state or nano-crystalline state. The channel layer 4 may also be formed through CVD process, epitaxial growing process, ALD process, etc. and the annealing process may be omitted if other material(s) is used or such anneal process is deemed unnecessary. Usually, one or more impurity-introducing processes such as ion implant processes or diffusion doping processes are performed to the channel layer 4 to form lightly-doped drain regions and/or source and drain regions within the channel layer 4 sandwiching the channel region within the channel layer 4, but these impurity-introducing processes are optional to the FET structure 10 of the present invention. Furthermore, a channel doping process may be optionally performed to the channel region (roughly defined by gate length $L_G$) of the channel layer 4 to adjust electrical properties of the FET structure 10 such as threshold voltage. If the channel layer 4 is incapable of forming ohmic contacts with the later-formed source and drain electrodes, an extra layer may be formed between the channel layer 4 and the source and drain electrodes or an additional implant process may be performed to alter portions of the channel layer 4 to be in contact with the later-formed source and drain electrodes. Then, a conductive material (an aluminum Al layer in this embodiment) is formed through evaporation deposition process, CVD process or PVD process and patterned through lithography and etching processes to become the source electrode 5 and drain electrode 6. The source electrode 5 and drain electrode 6 may also be formed through electroplating process and patterned through lift-off process or damascene process if other material(s) is used and/or smaller pitch is required. Now the FET structure 10 is completed. Afterward, a passivation layer (not shown in FIG. 1) may be formed on the FET structure 10 to protect the completed FET structure 10 and electrical contacts (not shown in FIG. 1) may be formed penetrating the passivation layer and contacting the gate electrode 2, the source electrode 5 and the drain electrode 6 to apply voltage or pick up signal. It is worth mentioning that the maximum process temperature among all the process temperatures used so far is equivalent to or less than 550° C. and the channel layer 4 remains at amorphous state or nano-crystalline state without exhibiting lattice-mismatch defects at the interface with the underlying gate dielectric layer 3. As such, the channel layer 4 of the present invention is ready to be applied to any underlying layer at amorphous state and the interface therebetween is free from lattice-mismatch defects. Since the work of present invention focuses on FET structures, the processes employed for pixel array such as forming pixel electrodes and ensuing processes employed for liquid crystal are omitted here.

Figure 2:
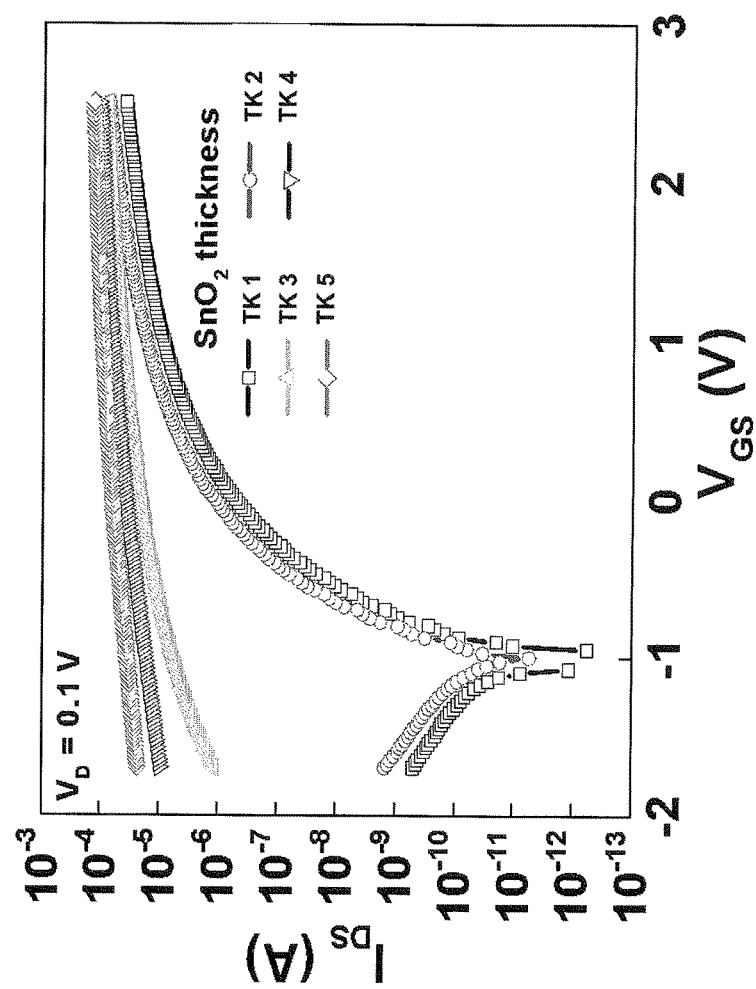
FIG. 2 shows relationships between currents between source and drain ($I_{DS}$) and gate voltages ($V_{GS}$) (usually called transfer characteristics and also called $I_D$-$V_G$ characteristics) for the exemplary FET structure of FIG. 1 having different channel layer ($SnO_2$) thicknesses.

Now referring to FIG. 2, FIG. 2 shows relationships between currents between sources and drain ($I_{DS}$) and gate voltages ($V_{GS}$) (usually called transfer characteristics and also called $I_D$-$V_G$ characteristics) for the exemplary FET structures 10 of FIG. 1 having channel layer $SnO_2$ thicknesses TK 1, TK 2, TK 3, TK 4, TK 5 falling in a range between 3.5 nm and 20 nm (including 3.5 nm and 20 nm). TK 1 represents the smallest thickness 3.5 nm while TK 5 represents the largest thickness 20 nm. TK 2, TK, 3, and TK 4 are between 3.5 nm and 20 nm. The channel length $L_G$ and channel width (along a direction perpendicular to the direction of channel length $L_G$) of this FET structure 10 are 50~150 μm and 500 μm respectively. The thickness of the gate dielectric $HfO_2$ layer is 40 nm. The left vertical axis of FIG. 2 represents current between source and drain ($I_{DS}$) in the unit of Ampere. The horizontal axis of FIG. 2 represents gate voltage ($V_{GS}$) in the unit of Volt. Drain voltage ($V_D$) applied to the FET structure 10 is 0.1V and gate voltage ($V_{GS}$) sweeps from −2 V to +2.5 V. From the results shown in FIG. 2, it is clear that the FET structures 10 having channel layer $SnO_2$ thicknesses of TK 5, TK 4, and TK 3 failed to show proper pinch-off behaviors while the FET structures 10 having channel layer $SnO_2$ thicknesses of TK 2 and TK 1 showed proper pinch-off behaviors. Not to be bound by any principles or theories, inventors of the present invention assume the FET structures having channel layer $SnO_2$ thicknesses of TK 5, TK 4, and TK 3 failed to show proper pinch off because of high conductivity. To support such assumption, inventors of the present invention measured the conductivities of the channel layers $SnO_2$ having thicknesses of TK 5, TK 4, and TK 2 and obtained conductivities of $3.6 \times 10^5$, $1.7 \times 10^5$, and $9.3 \times 10^4$ S/m respectively.

Figure 3:
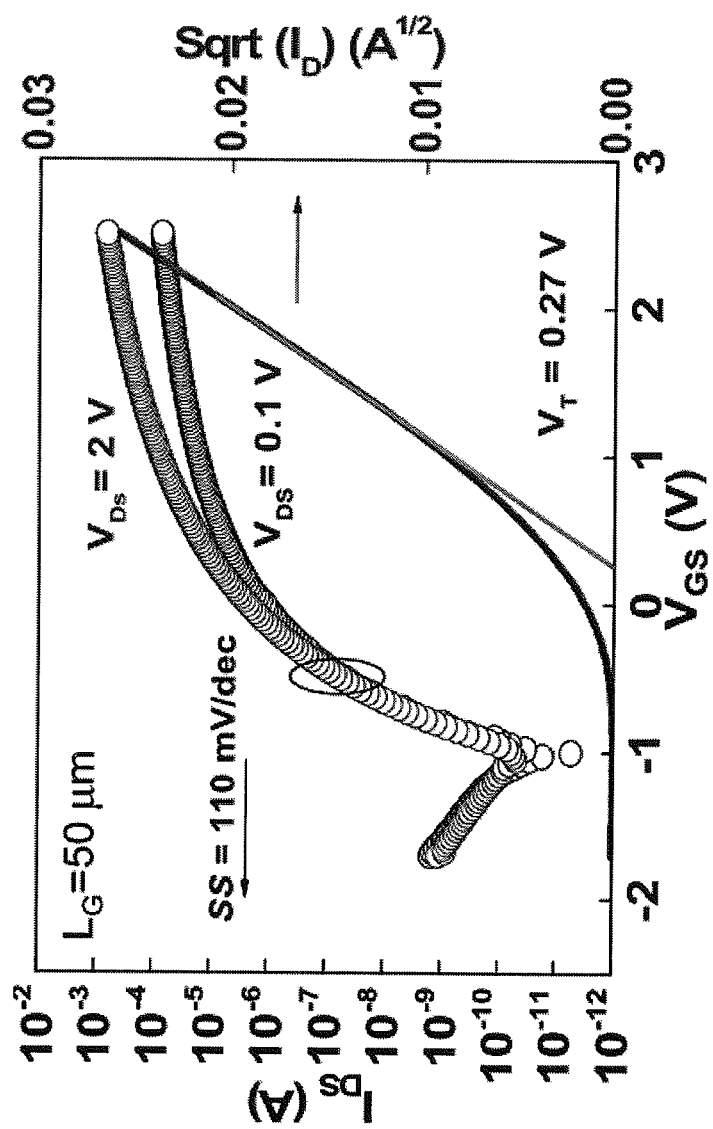
FIG. 3 shows transfer characteristics for the exemplary FET structure of FIG. 1 under different source-drain voltages ($V_{DS}$) and the threshold voltage obtained therefor.

Now referring to FIG. 3, FIG. 3 shows transfer characteristics for the exemplary FET structure 10 of FIG. 1 under different source-drain voltages ($V_{DS}$) and the threshold voltage obtained therefor. The left vertical axis of FIG. 3 represents current between source and drain ($I_{DS}$) in the unit of Ampere. The right vertical axis of FIG. 3 is for threshold voltage extraction. The horizontal axis of FIG. 2 represents gate voltage ($V_{GS}$) in the unit of Volt. Source-drain voltages ($V_{DS}$) applied to the FET structure having channel layer $SnO_2$ thickness of 4.5 nm are 2V and 0.1V and gate voltage ($V_{GS}$) sweeps from −2 V to +2.5 V. From FIG. 3, it is clear that the FET structure 10 exhibits good transistor characteristics at a low $V_{DS}$ of 0.1V. Furthermore, it is found that FET structure 10 exhibits a large on-current over off-current ($I_{ON}/I_{OFF}$) >107, a low threshold voltage $V_T$ of 0.27 V, and a small sub-threshold swing (SS) of 110 mV/dec indicating fast turn-on and aggressive driving capability.

Figure 4:
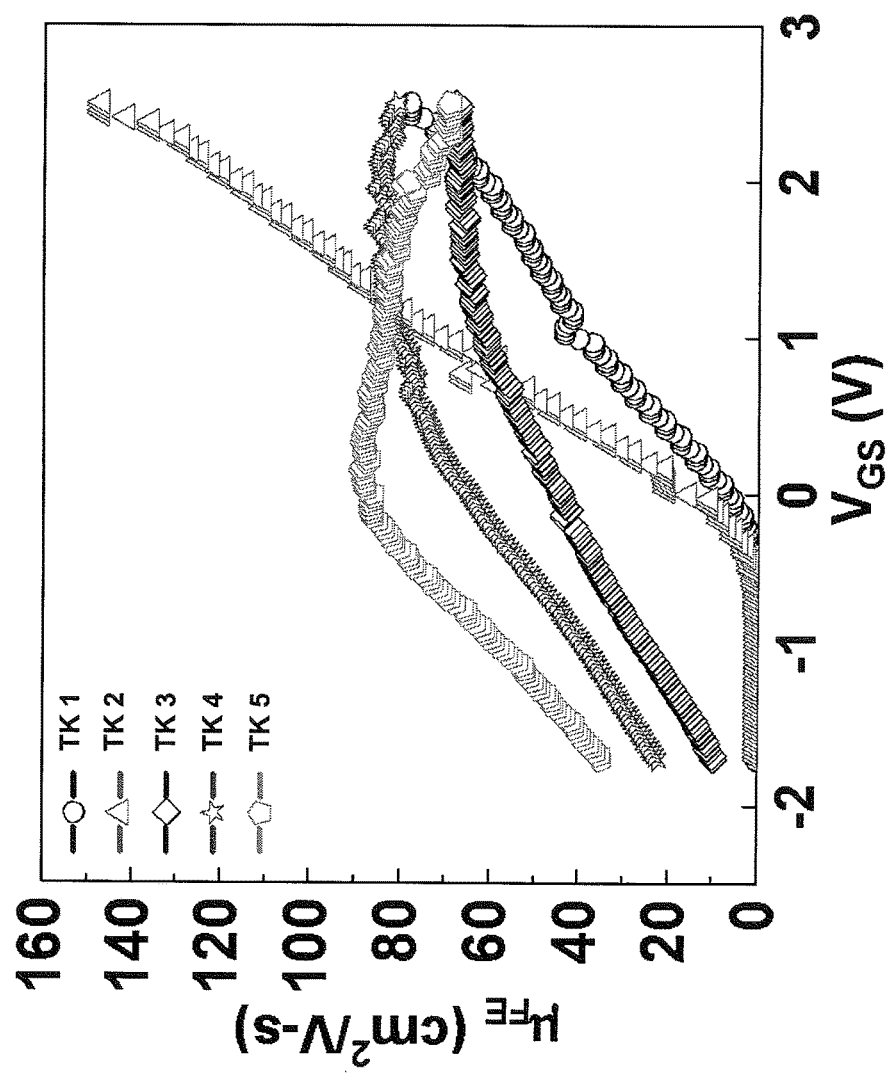
FIG. 4 shows relationships between mobilities and gate voltages ($V_{GS}$) for the exemplary FET structure of FIG. 1 having different channel layer ($SnO_2$) thicknesses.

Now referring to FIG. 4, FIG. 4 shows relationships between mobilities and gate voltages ($V_{GS}$) for the exemplary FET structure 10 of FIG. 1 having different channel layer ($SnO_2$) thicknesses. The vertical axis of FIG. 4 represents effective mobility ($\mu_{FE}$) in the unit of $cm^2$/V-s. The horizontal axis of FIG. 4 represents gate voltage ($V_{GS}$) in the unit of Volt. From FIG. 4, it is found that the effective mobilities ($\mu_{FE}$) of electrons at the channel layers $SnO_2$ with thicknesses of TK 1, TK 2, and TK 3 increase with the increase of gate voltage ($V_{GS}$) but would saturate after certain points of gate voltages ($V_{GS}$). On the contrary, the effective mobilities ($\mu_{FE}$) of electrons at the channel layers $SnO_2$ with thicknesses of TK 4 and TK 5 do not reach saturation and the effective mobility of electrons at the channel layer $SnO_2$ with thicknesses of TK 4 even reaches an unreported high level of 147 $cm^2/Vs$. The inventors of the present invention believe such high level of effective mobility is achieved due to fully depletion of the ultra-thin channel layer $SnO_2$. The fully depleted ultra-thin channel layer $SnO_2$ allows the majority carriers (electrons) to flow near the interface between the fully depleted ultra-thin channel layer $SnO_2$ and the gate dielectric layer. Without being scattered in the bulk channel layer $SnO_2$, the electrons reach an unreported high level of mobility 147 $cm^2/Vs$.

The bottom-gate type enhancement-mode n-type FET structure with ultra-thin metal oxide channel layer of the present invention can achieve low leakage current ($I_{OFF}$), high on-current ($I_{ON}$) at small supply voltage ($V_{DD}$) for low power operation. The high effective mobility ($\mu_{FE}$) and low leakage current ($I_{OFF}$) reported of such n-type FET may address the issues troubling 3-D fin-type field effect transistors (FinFET) due to quantum mechanics. The method for fabricating the bottom-gate type enhancement-mode n-type FET with ultra-thin metal oxide channel layer of the present invention is relatively simple. Because the ultra-thin metal oxide channel layer of the present invention remains at amorphous state or nano-crystalline state and is free from lattice-mismatch at the interface with an underlying layer, the ultra-thin metal oxide channel layer of the present invention can be formed on any surfaces of any materials to be integrated with any electronic devices.

In the following embodiments, the last digit of a number for an element identifies such element. For example, numbers 101, 201, 301, 401, etc. all have 1 as their last digit and they all represent a substrate even though they may not be the same substrates of the same materials or compositions. Similarly, the last digits 2, 3, 4, 5, and 6 represent a gate electrode, a gate dielectric layer, a channel layer, source electrode, and drain electrode respectively. Although in the following embodiments the sequence of forming these elements may vary, the maximum process temperature among all the process temperatures used after formation of the channel layer should be equivalent to or less than a threshold temperature (for example 550° C. for $SnO_2$) in order for the channel layer to remain at amorphous state or nano-crystalline state. Furthermore, if a metal oxide other than $SnO_2$ (ITO, ZnO, $SnO_2$ or $In_2O_3$) is used for the channel layer, the thickness of the metal oxide should be less than a threshold value that with a thickness less than such threshold value the metal oxide would exhibit pinch-off behavior in transfer characteristics and has a mobility trend without saturation (under operational $V_{GS}$).

Figure 5:
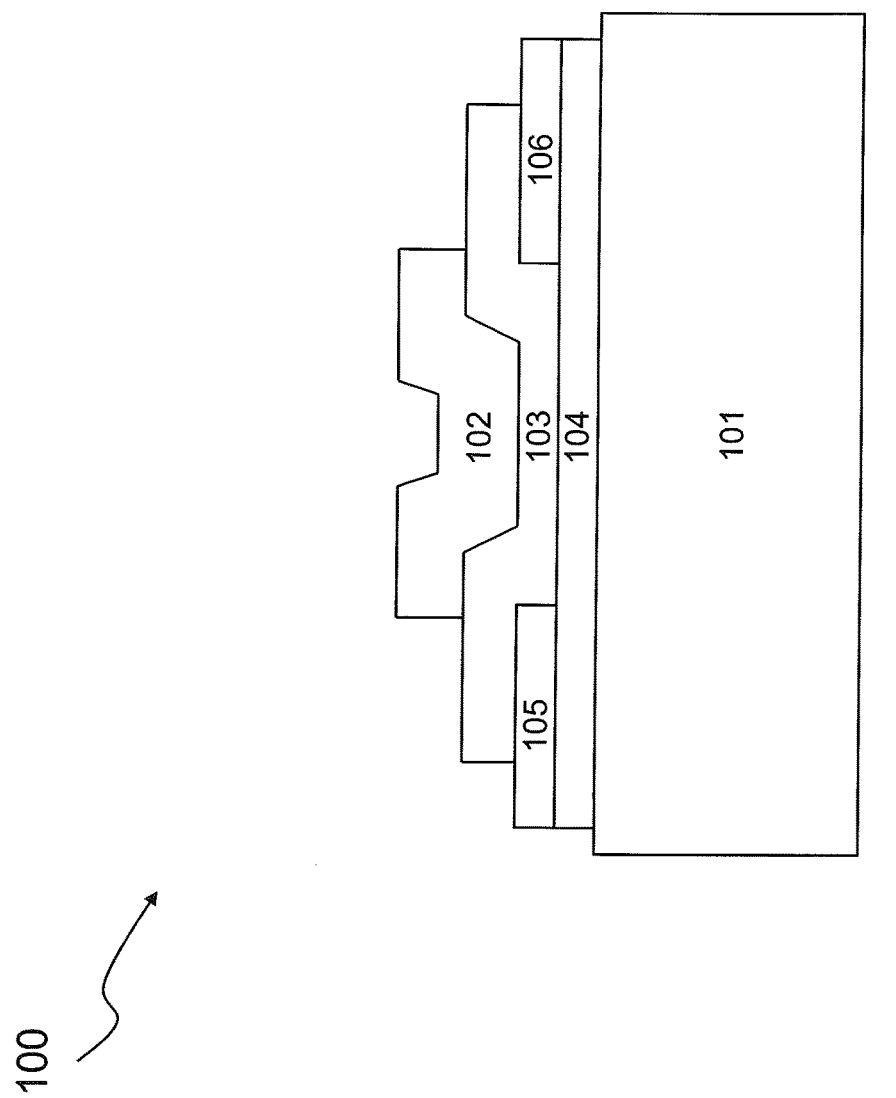
FIG. 5 is a schematic cross-sectional view illustrating a top-gate coplanar-type FET structure according to an embodiment of the present invention.

Now referring to FIG. 5, FIG. 5 is a schematic cross-sectional view illustrating a top-gate coplanar-type FET structure 100 having the ultra-thin metal oxide channel layer according to an embodiment of the present invention. FET structure 100 a substrate 101, a channel layer 104 formed on the substrate 101, source electrode 105 and drain electrode 106 formed at two opposite sides of the channel layer 104, a gate dielectric layer 103 formed on the channel layer 104 and the source electrode 105 and the drain electrode 106, and a gate electrode 102 formed on the gate dielectric layer 103 and physically separated from the channel layer 104 by the gate dielectric layer 3. The channel layer 4 provides a controllable electrical pathway between the source electrode 105 and the drain electrode 106. It is noted that in this embodiment, the channel layer 104 is in direct contact with the substrate 101, so the substrate 101 must comprise an insulating layer or be of insulating material in order to electrically insulate the channel layer 104 of this FET structure 100 from another channel layer 104 of another FET structure 100 (not shown). All the materials addressed for the substrate 1, the gate electrode 2, the gate dielectric layer 3, the channel layer 4, the source electrode 5 and the drain electrode 6 of FIG. 1 may also be used for the substrate 101, the gate electrode 102, the gate dielectric layer 103, the channel layer 104, the source electrode 105 and the drain electrode 106 respectively. The most importantly, the channel layer must be an ultra-thin film with a thickness less than 10 nm (when the channel layer is an amorphous or nano-crystalline $SnO_2$ layer).

Now still referring to FIG. 5, in order to fabricate the FET structure 100, a method for fabricating the FET structure 100 is disclosed. First, a substrate 101 is provided. Next, a channel layer (an amorphous or nano-crystalline $SnO_2$ layer in this embodiment) having a thickness less than 10 nm is formed through evaporation deposition process, annealed at for example 400° C. by rapid thermal anneal process for example in an environment containing oxygen gas and patterned through lithography and etching processes to become the channel layer 104. The channel layer 104 may also be formed through other processes mentioned earlier with reference to FIG. 1 and the annealing process may also be omitted. Then, a conductive material is formed through CVD process, evaporation deposition process or PVD process and patterned through lithography and etching processes to become the source electrode 105 and the drain electrode 106. The source electrode 105 and the drain electrode 106 may also be formed and patterned through other processes mentioned earlier with reference to FIG. 1. Then, the gate dielectric layer 103 is formed through CVD process or ALD process depending on its thickness. The gate dielectric layer 103 may also be formed through other processes with reference to FIG. 1. Next, a gate electrode layer is formed through PVD process or CVD process and patterned through lithography and etching processes to become the gate electrode 102. The gate electrode layer may also be formed and patterned through other processes mentioned earlier with reference to FIG. 1. Now the FET structure 100 is completed. Afterward, a passivation layer (not shown in FIG. 5) may be formed on the FET structure 100 to protect the FET structure 100 and contacts (not shown in FIG. 5) may be formed penetrating the passivation layer and contacting the gate electrode 102, the source electrode 105 and the drain electrode 106 to apply voltages or pick up signal. Similarly, the maximum process temperature among all the process temperatures used after formation of the channel layer 104 should be equivalent to or less than a threshold temperature (for example less than 550° C. for $SnO_2$) in order for the channel layer 104 to remain at amorphous state or nano-crystalline state without exhibiting lattice-mismatch defects at the interface with the overlying gate dielectric layer 103. As such, the channel layer 104 of the present invention is ready to be applied to any substrate having a top surface at amorphous state and the interface therebetween is free from lattice-mismatch defects. Since the work of present invention focuses on the FET structure 100, the processes employed for pixel array such as forming pixel electrodes and ensuing processes employed for liquid crystal are omitted here.

Figure 6:
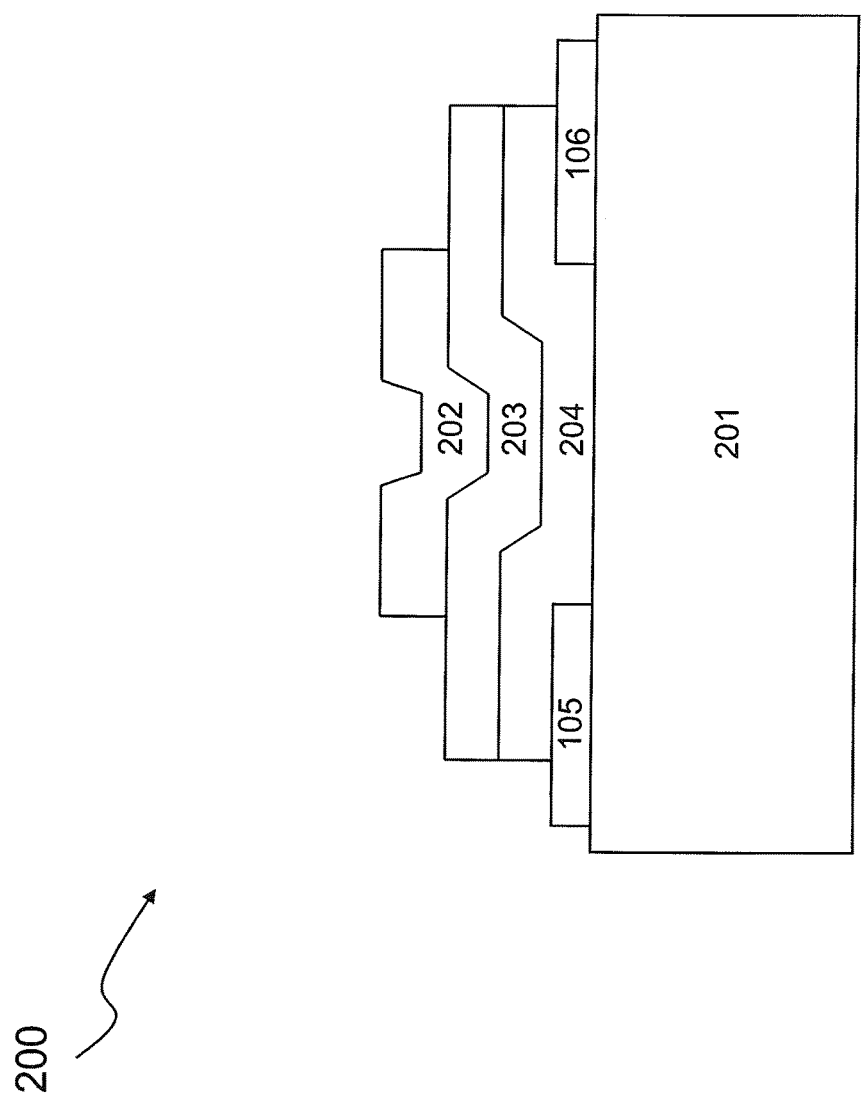
FIG. 6 is a schematic cross-sectional view illustrating a top-gate staggered-type FET structure according to another embodiment of the present invention.

Now referring to FIG. 6, FIG. 6 is a schematic cross-sectional view illustrating a top-gate staggered-type FET structure 200 having the ultra-thin metal oxide channel layer according to another embodiment of the present invention.

FET structure 200 comprises a substrate 201, a source electrode 205 and a drain electrode 206 formed in a spaced-apart fashion on the substrate 201, a channel layer 204 formed on the source electrode 205 and the drain electrode 206 and the substrate 201, a gate dielectric layer 203 formed on the channel layer 204, and a gate electrode 202 formed on the gate dielectric layer 203 and physically separated from the channel layer 204 by the gate dielectric layer 203. The materials used for the FET structure 200 and the processes for manufacturing the FET structure 200 are similar to the materials used for the FET structure 100 of FIG. 5 and the processes for manufacturing the FET structure 100 of FIG. 5. The only differences between the FET structure 200 of this embodiment and the FET structure 100 of FIG. 5 are the relative locations of the source and drain electrodes and the sequence of their formation among formations of other layers/elements. In this embodiment the source and drain electrodes are formed between the substrate and the channel layer instead of between the channel layer and gate dielectric layer as shown in FIG. 5. To save meaningless repetitions, the materials used for and the processes for manufacturing the FET structure 200 are omitted and can refer to that of the FET structure 100 of FIG. 5.

Figure 7:
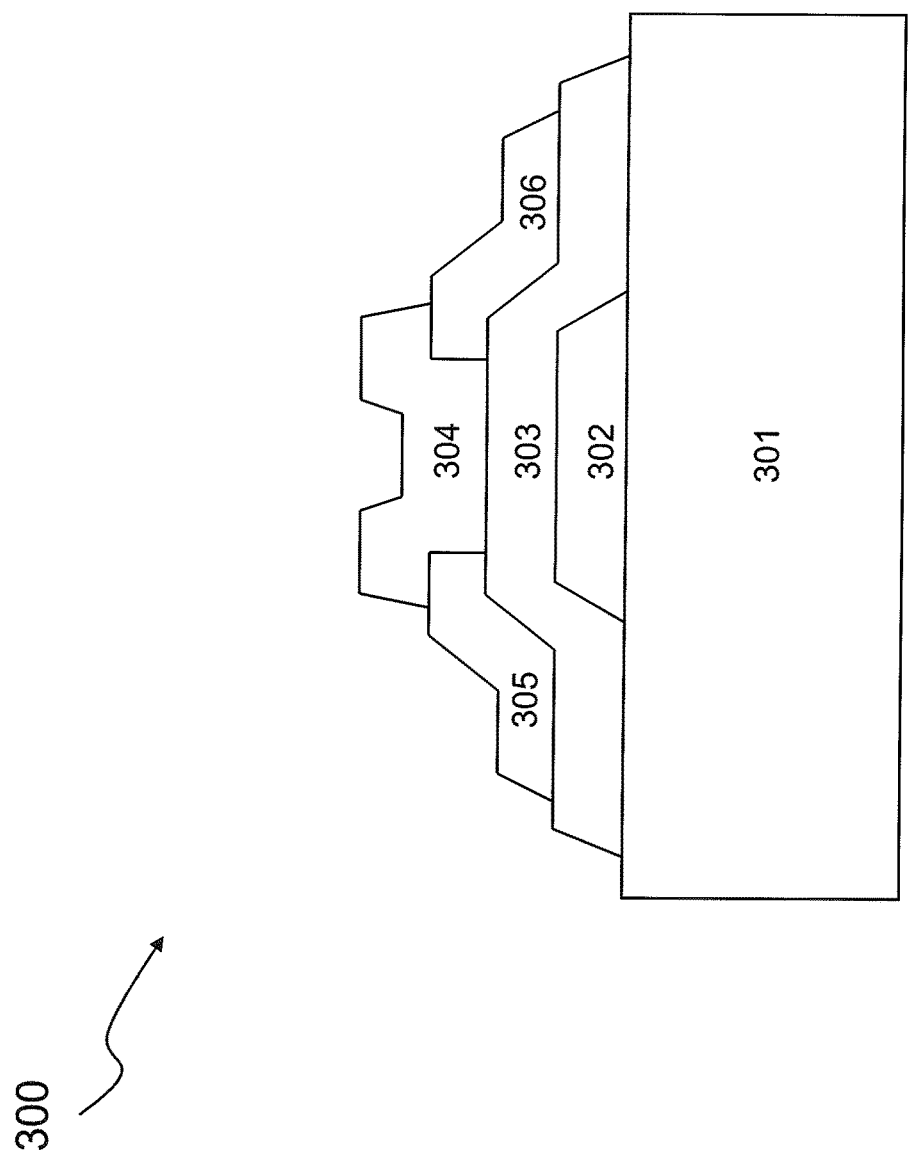
FIG. 7 is a schematic cross-sectional view illustrating a bottom-gate coplanar-type FET structure according to another embodiment of the present invention.

Now referring to FIG. 7, FIG. 7 is a schematic cross-sectional view illustrating a bottom-gate coplanar-type FET structure 300 having the ultra-thin metal oxide channel layer according to another embodiment of the present invention. The FET structure 300 comprises a substrate 301, a gate electrode 302 formed on the substrate 301, a gate dielectric layer 303 formed on the gate electrode 302, a source electrode 305 and a drain electrode 306 formed on the gate dielectric layer 303 at opposite sides of the gate electrode 302, and a channel layer 304 formed on the source electrode 305 and the drain electrode 306 and the gate dielectric layer 303 and being physically separated from the gate electrode 302 by the gate dielectric layer 303. The materials used for the FET structure 300 and the processes for manufacturing the FET structure 300 are similar to the materials used for the FET structure 10 of FIG. 1 and the processes for manufacturing the FET structure 10 of FIG. 1. The only differences between the FET structure 300 of this embodiment and the FET structure 10 of FIG. 1 are the relative location of the channel layer and the sequence of its formation among formations of other layers/elements. In this embodiment the channel layer is formed on top of the source and drain electrodes instead of under the source and drain electrodes as shown in FIG. 1. To save meaningless repetitions, the materials used for and the processes for manufacturing the FET structure 300 are omitted and can refer to that of the FET structure 10 of FIG. 1.

Figure 8:
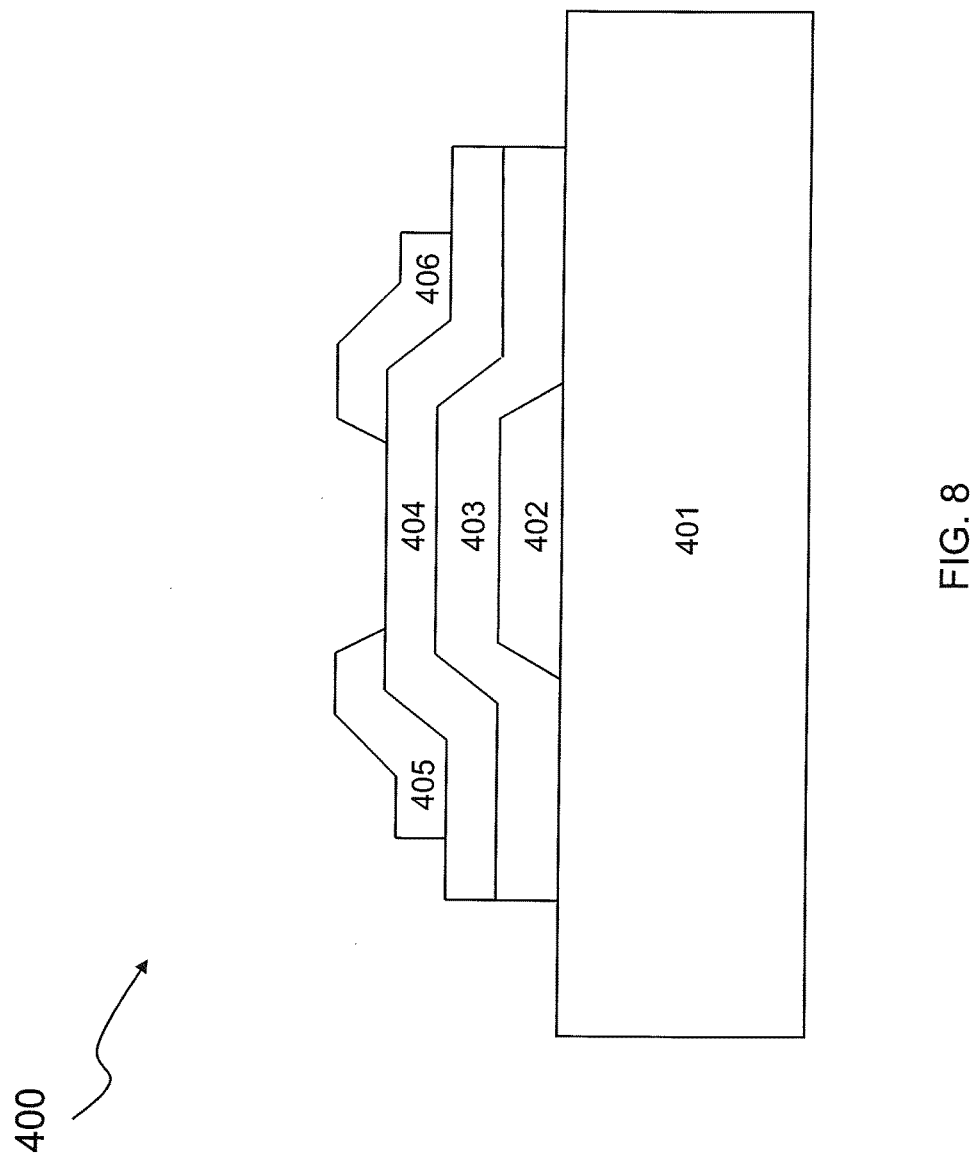
FIG. 8 is a schematic cross-sectional view illustrating a bottom-gate staggered-type FET structure according to another embodiment of the present invention.

Now referring to FIG. 8, FIG. 8 is a schematic cross-sectional view illustrating a bottom-gate staggered-type FET structure 400 having the ultra-thin metal oxide channel layer according to another embodiment of the present invention. The FET structure 400 is a more accurate version of the FET structure 10 of FIG. 1 and comprises a substrate 401, a gate electrode 402 formed on the substrate, a gate dielectric layer 403 formed on the gate electrode 402 and the substrate 401, a channel layer 404 formed on the gate dielectric layer 403, and a source electrode 405 and a drain electrode 406 formed on the channel layer 404 at two sides of the channel layer 404. The materials used for the FET structure 400 and the processes for manufacturing the FET structure 400 are the same with the materials used for the FET structure 10 of FIG. 1 and the processes for manufacturing the FET structure 10 of FIG. 1. To save meaningless repetitions, the materials used for and the processes for manufacturing the FET structure 400 are omitted and can refer to that of the FET structure 10 of FIG. 1.

Figure 9:
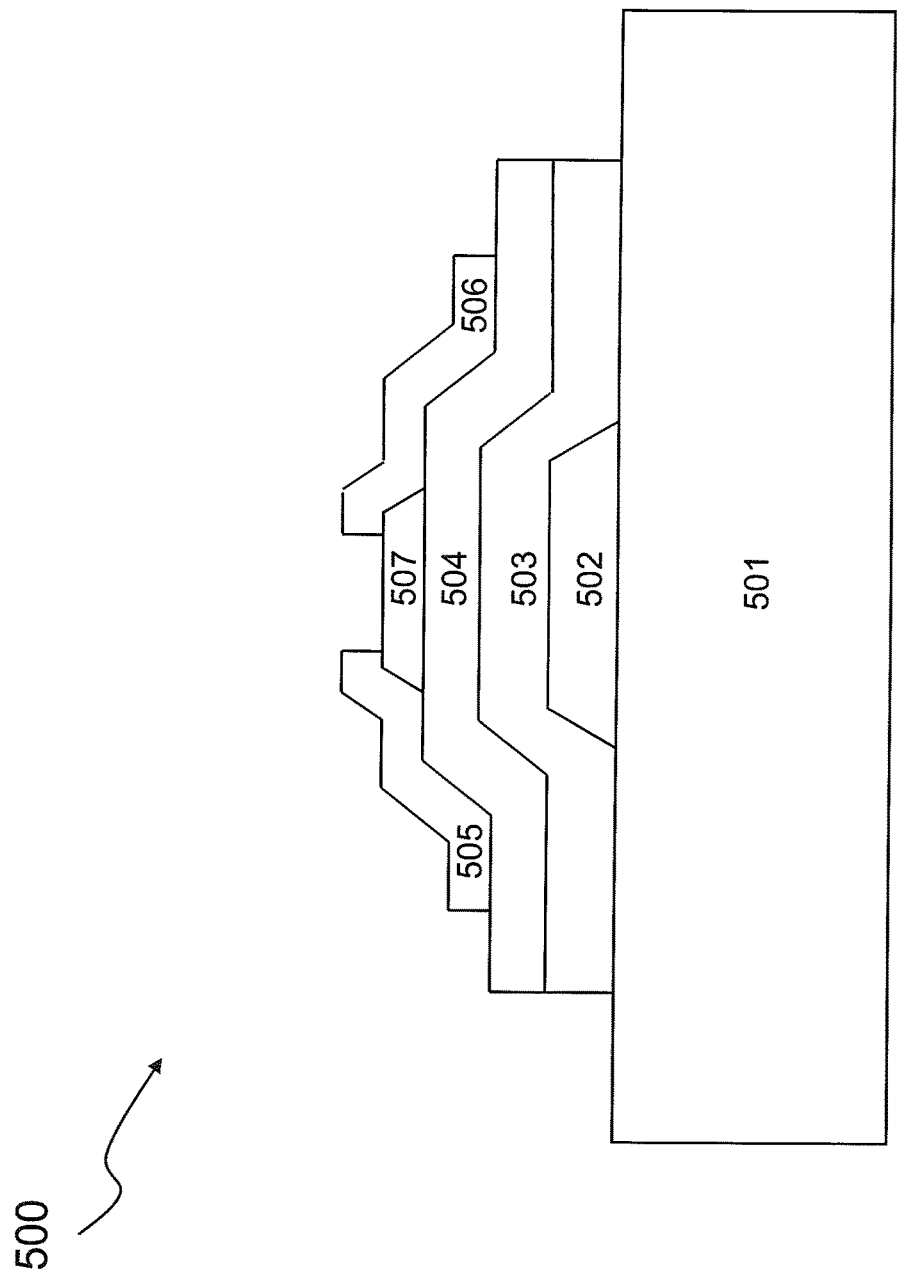
FIG. 9 is a schematic cross-sectional view illustrating a bottom-gate staggered-type FET structure having an extra etching stop layer according to another embodiment of the present invention.

Now referring to FIG. 9, FIG. 9 is a schematic cross-sectional view illustrating a bottom-gate staggered-type FET structure 500 having an extra etching stop layer and an ultra-thin metal oxide channel layer according to another embodiment of the present invention. The FET structure 500 is very similar to the FET structure 400 of FIG. 8. The only difference between the FET structure 500 and the FET structure 400 is that the FET structure 500 comprises an extra etching stop layer 507 between the channel layer 504 and the source electrode 505 and the drain electrode 506. The main function of this extra etching stop layer 507 is to prevent the channel layer 504 from being damaged or etched during the patterning process of the source electrode 505 and the drain electrode 506. The material for the extra etching stop layer 507 is so chosen that high etching selectivity is achieved between the extra etching stop layer 507 and the source electrode 505 and the drain electrode 506. Or, the thickness of the extra etching stop layer 505 is so chosen that the extra etching stop layer 505 can resist etching process of the source electrode 505 and the drain electrode 506 and have some thickness remained after the etching process of the source electrode 505 and the drain electrode 506. Preferably, the extra etching stop layer 505 may use a dielectric material such as silicon dioxide, silicon nitride, oxynitride, silicon carbide, etc. The materials used for the rest of the elements of the FET structure 500 and the processes for manufacturing the rest of the elements of the FET structure 500 are the same with the materials used for the FET structure 400 of FIG. 8 and the processes for manufacturing the FET structure 400 of FIG. 8. To save meaningless repetitions, the materials used for and the processes for manufacturing the FET structure 500 are omitted and can refer to that of the FET structure 400 of FIG. 8.

Figure 10:
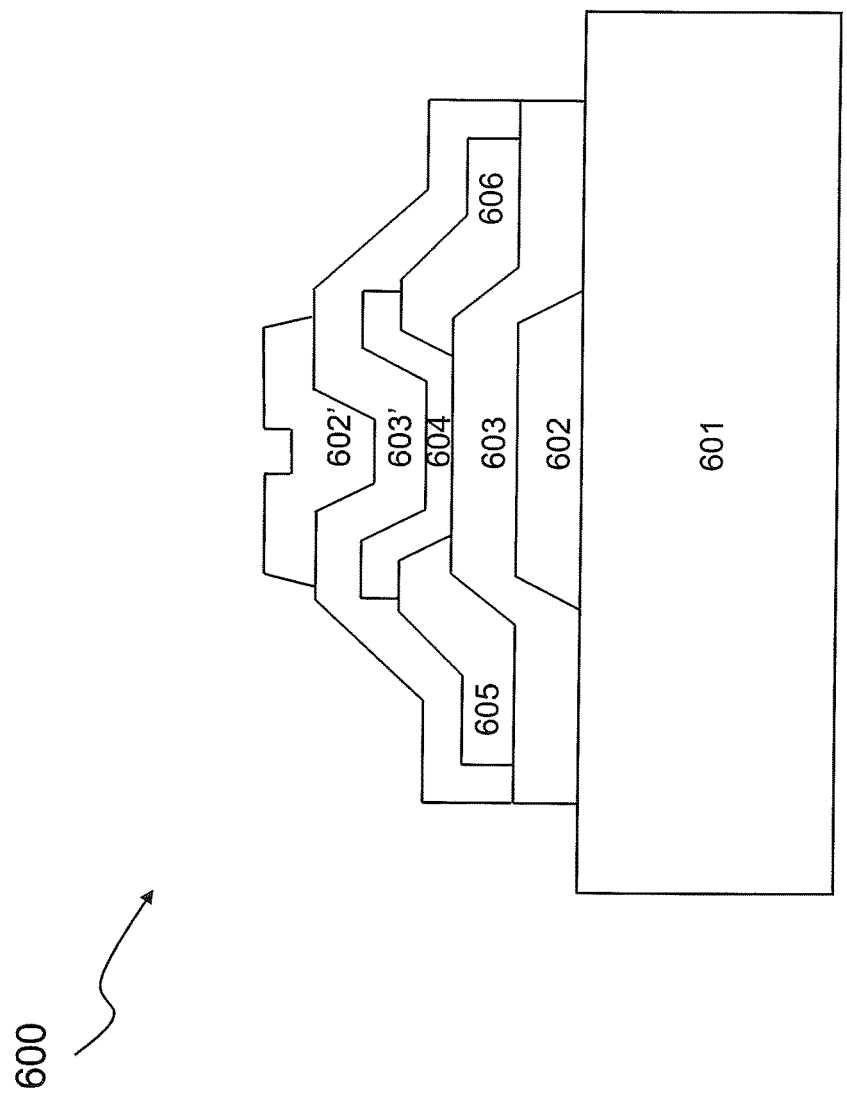
FIG. 10 is a schematic cross-sectional view illustrating a double-gate type FET structure according to another embodiment of the present invention.

Now referring to FIG. 10, FIG. 10 is a schematic cross-sectional view illustrating a double-gate type FET structure 600 having an ultra-thin metal oxide channel layer and dual gate dielectric layers and dual gate electrodes according to another embodiment of the present invention. The double-gate type FET has better current carrying capability and may meet specific design needs. The FET structure 600 is similar to the FET structure 300 of FIG. 7. The only difference between the FET structure 600 and the FET structure 300 is that the FET structure 600 further comprises a second dielectric layer 603' and a second gate electrode 602'. The second dielectric layer 603' is formed on top of the channel layer 604, the source electrode 605, and the drain electrode 606. The second gate electrode 602' is formed on the second dielectric layer 603'. The gate electrode 602, the gate dielectric layer 603, the channel layer 604, the source electrode 605, and the drain electrode 606 constitute a first FET structure. The second gate electrode 602', the second gate dielectric layer 603', the channel layer 604, the source electrode 605, and the drain electrode 606 constitute a second FET structure. The first FET structure and the second FET structure share the source electrode 605 and the drain electrode 606. The materials used for the FET structure 600 and the processes for manufacturing the FET structure 600 are similar with the materials used for the FET structure 300 of FIG. 7 and the processes for manufacturing the FET structure 300 of FIG. 7. It is noted that the materials and processes for the gate electrode 602 and the gate dielectric layer 603 may also be applied to the second gate electrode 602' and the second gate dielectric layer 603'. To save meaningless repetitions, the materials used for and the processes for manufacturing the FET structure 600 are omitted and can refer to that of the FET structure 300 of FIG. 7.

Figure 11:
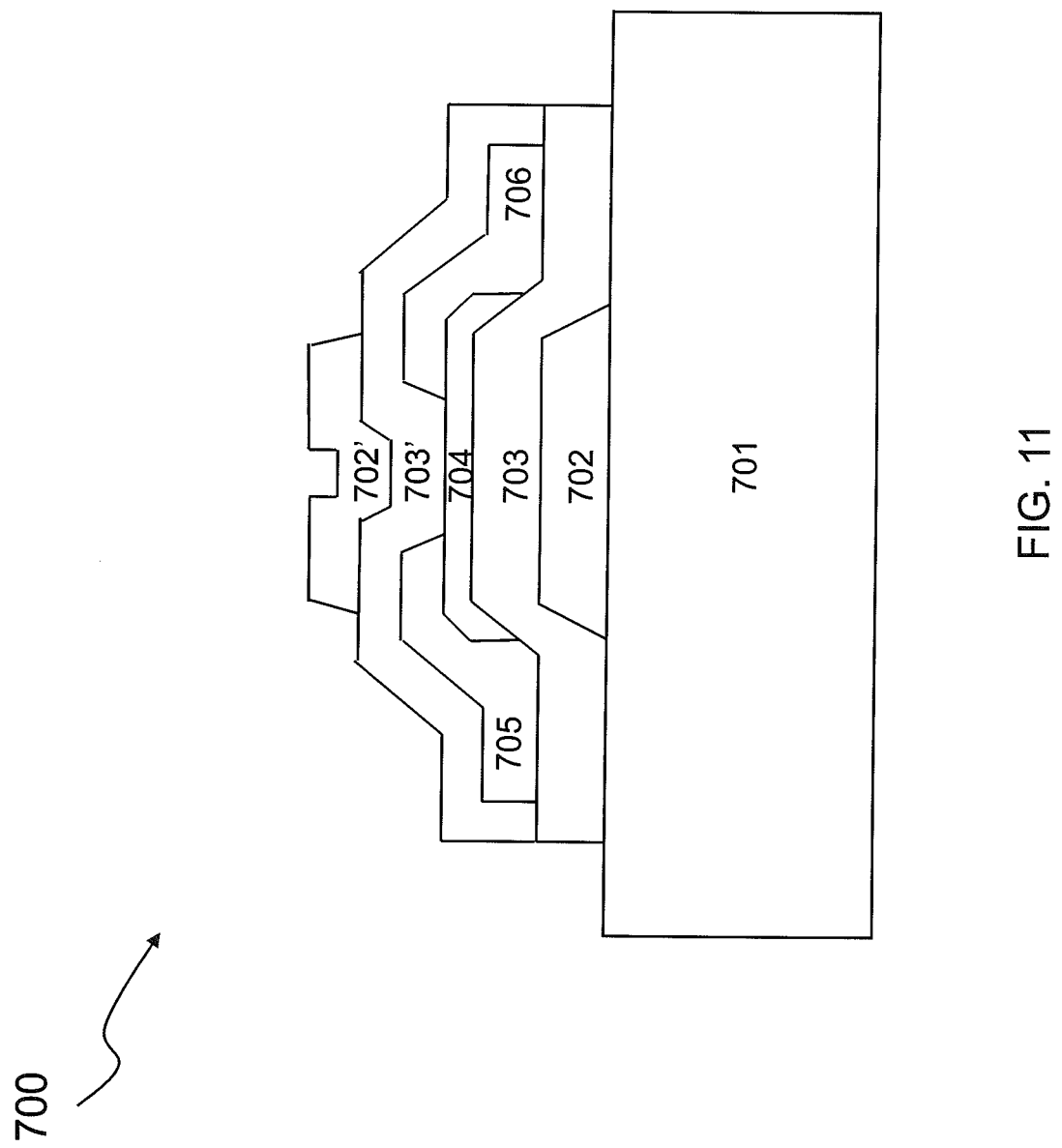
FIG. 11 is a schematic cross-sectional view illustrating a double-gate type FET structure according to yet another embodiment of the present invention.

Now referring to FIG. 11, FIG. 11 is a schematic cross-sectional view illustrating a double-gate type FET structure 700 having an ultra-thin metal oxide channel layer and dual gate dielectric layers and dual gate electrodes according to yet another embodiment of the present invention. The FET structure 700 is similar to the FET structure 400 of FIG. 8 and is also similar to the FET structure 600 of FIG. 10. The only difference between the FET structure 700 and the FET structure 400 is that the FET structure 700 further comprises a second dielectric layer 703' and a second gate electrode 702'. The only difference between the FET structure 700 and the FET structure 600 is the relative location of the channel layer with respect to the source electrode and the drain electrode. In the FET structure 700 the channel layer 704 is below the source electrode 705 and the drain electrode 706 while in the FET structure 600 the channel layer 604 is on top of the source electrode 605 and the drain electrode 606. To save meaningless repetitions, the materials used for and the processes for manufacturing the FET structure 700 are omitted and can refer to that of the FET structure 400 of FIG. 8 and that of the FET structure 600 of FIG. 10.

Although in the foregoing embodiments each layer/element of the FET structures is described as being patterned separately and individually, two or more of these layers/elements of the FET structures may be formed sequentially into a film stack and patterned together or individually. Furthermore, a layer is "formed" does not mean it can't be "formed and patterned." To integrate with other devices such as a passive device, a pixel unit, a memory cell, etc., the processes for manufacturing the FET structure may adapt to accommodate these devices. The present invention is not limited to the processes and their sequence disclosed therein but covers all the potential processes and various sequences capable of fabricating the enhancement-mode n-type FET structure with ultra-thin metal oxide channel layer of the present invention.

The enhancement-mode n-type FET structure with ultra-thin metal oxide channel layer of the present invention covers different types of field effect transistors as long as they use channel layers. The enhancement-mode n-type FET structure with ultra-thin metal oxide channel layer of the present invention can achieve low leakage current ($T_{OFF}$), high on-current ($I_{ON}$) at small supply voltage ($V_{DD}$) for low power operation due to unexpected excellent electrical properties of the ultra-thin metal oxide layer including unreported high effective mobility. The method for fabricating the enhancement-mode n-type FET with ultra-thin metal oxide channel layer of the present invention is relatively simple. Because the ultra-thin metal oxide channel layer of the present invention remains at amorphous state or nano-crystalline state and is free from lattice-mismatch at the interface with an underlying layer, the ultra-thin metal oxide channel layer of the present invention can be formed on any surfaces of any materials to be integrated with any electronic devices.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An enhancement-mode n-type field effect transistor comprising:
   a metal oxide channel layer comprising $SnO_2$ and having a thickness less than a threshold value;
   a gate dielectric layer;
   a gate electrode physically separated from the metal oxide channel layer by the gate dielectric layer;
   a source electrode; and
   a drain electrode,
   wherein having the thickness less than the threshold value the metal oxide channel layer exhibits pinch-off behavior in transfer characteristics and has a mobility trend without saturation under positive operational voltage, wherein under a positive gate voltage an effective mobility of 147 $cm^2$/Vs is obtained.

2. The enhancement-mode n-type field effect transistor of claim 1, wherein the metal oxide channel layer is at amorphous state or nano-crystalline state.

3. The enhancement-mode n-type field effect transistor of claim 1, wherein the metal oxide channel layer has a thickness less than 10 nm.

4. The enhancement-mode n-type field effect transistor of claim 1, wherein the gate dielectric layer comprises a high-k dielectric material.

5. The enhancement-mode n-type field effect transistor of claim 1, wherein the gate dielectric layer comprises a thickness ranging from 30 nm to 150 nm.

6. The enhancement-mode n-type field effect transistor of claim 1, wherein the enhancement-mode n-type field effect transistor is a bottom-gate type field effect transistor with the gate electrode closer to a substrate than the metal oxide channel layer.

7. The enhancement-mode n-type field effect transistor of claim 6, further comprising an etching stop layer between the metal oxide channel layer and the source electrode and the drain electrode.

8. The enhancement-mode n-type field effect transistor of claim 6, further comprising another gate electrode and another gate dielectric layer.

9. The enhancement-mode n-type field effect transistor of claim 1, wherein the enhancement-mode n-type field effect transistor is a top-gate type field effect transistor with the metal oxide channel layer closer to a substrate than the gate electrode.

10. An enhancement-mode n-type field effect transistor comprising:
    a metal oxide channel layer at amorphous state or nano-crystalline state comprising $SnO_2$, wherein under a positive gate voltage an effective mobility of 147 $cm^2$/Vs is obtained;
    a gate dielectric layer;
    a gate electrode physically separated from the amorphous or nano-crystalline metal oxide channel layer by the gate dielectric layer;
    a source electrode; and
    a drain electrode.

11. The enhancement-mode n-type field effect transistor of claim 10, wherein the amorphous or nano-crystalline metal oxide channel layer has a thickness less than a threshold value and with such thickness the amorphous or nano-crystalline metal oxide channel layer exhibits pinch-off behavior in transfer characteristics and has a mobility trend without saturation under positive operational voltage.

12. The enhancement-mode n-type field effect transistor of claim 10, wherein the amorphous or nano-crystalline metal oxide channel layer has a thickness less than 10 nm.

13. The enhancement-mode n-type field effect transistor of claim 10, wherein the gate dielectric layer comprises a high-k dielectric material.

14. The enhancement-mode n-type field effect transistor of claim 10, wherein the gate dielectric layer comprises a thickness ranging from 30 nm to 150 nm.

15. The enhancement-mode n-type field effect transistor of claim 10, wherein the enhancement-mode n-type field effect transistor is a bottom-gate type field effect transistor with the gate electrode closer to a substrate than the amorphous or nano-crystalline metal oxide channel layer.

16. The enhancement-mode n-type field effect transistor of claim 15, further comprising an etching stop layer between the amorphous or nano-crystalline metal oxide channel layer and the source electrode and the drain electrode.

17. The enhancement-mode n-type field effect transistor of claim 15, further comprising another gate electrode and another gate dielectric layer.

18. The enhancement-mode n-type field effect transistor of claim 10, wherein the enhancement-mode n-type field effect transistor is a top-gate type field effect transistor with the amorphous or nano-crystalline metal oxide channel layer closer to a substrate than the gate electrode.

19. An enhancement-mode n-type field effect transistor comprising:
   a metal oxide channel layer comprising $SnO_2$ and having a conductivity of $1.7 \times 10^5$ S/m;
   a gate electrode physically separated from the metal oxide channel layer by the gate dielectric layer;
   a source electrode; and
   a drain electrode.

20. The enhancement-mode n-type field effect transistor of claim 19, wherein the metal oxide channel layer is at amorphous state or nano-crystalline state.

21. The enhancement-mode n-type field effect transistor of claim 19, wherein the metal oxide channel layer has a thickness less than 10 nm.

22. The enhancement-mode n-type field effect transistor of claim 19, wherein the gate dielectric layer comprises a high-k dielectric material.

23. The enhancement-mode n-type field effect transistor of claim 22, wherein the gate dielectric layer comprises a thickness ranging from 30 nm to 150 nm.

24. The enhancement-mode n-type field effect transistor of claim 19, wherein the enhancement-mode n-type field effect transistor is a bottom-gate type field effect transistor with the gate electrode closer to a substrate than the metal oxide channel layer.

25. The enhancement-mode n-type field effect transistor of claim 24, further comprising an etching stop layer between the metal oxide channel layer and the source electrode and the drain electrode.

26. The enhancement-mode n-type field effect transistor of claim 24, further comprising another gate electrode and another gate dielectric layer.

27. The enhancement-mode n-type field effect transistor of claim 19, wherein the enhancement-mode n-type field effect transistor is a top-gate type field effect transistor with the metal oxide channel layer closer to a substrate than the gate electrode.

* * * * *